United States Patent [19]

Boettcher et al.

[11] Patent Number: 4,886,735

[45] Date of Patent: Dec. 12, 1989

[54] PHOTOPOLYMERIZABLE RECORDING MATERIALS AND PHOTORESIST LAYERS AND LITHOGRAPHIC PRINTING PLATES BASED THEREON

[75] Inventors: Andreas Boettcher, Leimen; Martin Fischer; Reinhard Aldag, both of Ludwigshafen; Thomas Bluemel, Erpolzheim, all of Fed. Rep. of Germany

[73] Assignee: BASF Aktiengesellschaft, Ludwigshafen, Fed. Rep. of Germany

[21] Appl. No.: 195,008

[22] Filed: May 17, 1988

[30] Foreign Application Priority Data

May 21, 1987 [DE] Fed. Rep. of Germany ....... 3717037

[51] Int. Cl.$^4$ .......................... G03C 1/68; G03C 1/70
[52] U.S. Cl. ..................................... 430/332; 430/270;
430/281; 430/302; 430/520; 430/528; 430/915;
430/919; 430/920; 204/157.69; 204/157.71;
204/157.72
[58] Field of Search ............... 430/281, 528, 520, 915,
430/919, 920, 270, 332; 204/157.69, 157.72,
157.71, 302

[56] References Cited

U.S. PATENT DOCUMENTS

| | | |
|---|---|---|
| 3,282,693 | 11/1966 | Sagura et al. . |
| 3,427,161 | 2/1969 | Laridon . |
| 3,449,367 | 12/1970 | Teh-lin Chang . |
| 3,552,973 | 1/1971 | Fishman . |
| 3,574,622 | 2/1974 | Jenkins et al. . |
| 3,615,568 | 10/1971 | Jenkins . |
| 3,699,026 | 10/1972 | Jenkins et al. . |
| 3,883,351 | 5/1975 | Lewis . |
| 3,899,338 | 8/1975 | Lewis . |
| 4,065,315 | 12/1977 | Yamazaki et al. . |
| 4,154,463 | 5/1979 | Burri . |
| 4,162,274 | 7/1979 | Rosenkranz . |
| 4,228,232 | 10/1980 | Rousseau . |
| 4,304,923 | 12/1981 | Rousseau . |
| 4,598,036 | 7/1986 | Iwasaki et al. . |

FOREIGN PATENT DOCUMENTS

| | | |
|---|---|---|
| 870006 | 5/1971 | Canada . |
| 0019219 | 3/1972 | European Pat. Off. . |
| 0005379 | 8/1975 | European Pat. Off. . |
| 80/01846 | 4/1971 | Int'l Pat. Institute . |
| 1489425 | 6/1976 | United Kingdom . |
| 1030887 | 6/1977 | United Kingdom . |
| 2083832 | 3/1981 | United Kingdom . |

OTHER PUBLICATIONS

R. A. Abramovitch & E. M. Smith, "Pyridine and Its Derivatives", vol. 14, Part 2, p. 1 (1974).
Derwent Publication 85-290724/47, (Patent Abstract of DE 3,517,173).

*Primary Examiner*—Paul R. Michl
*Assistant Examiner*—Thorl Chea
*Attorney, Agent, or Firm*—Keil & Weinkauf

[57] ABSTRACT

Photopolymerizable recording materials suitable for producing photoresist layers and lithographic printing plates are composed of one or more photopolymerizable olefinically unsaturated organic compounds, optionally a polymeric binder, one or more photopolymerization initiators, a color-forming system which on irradiation with actinic light causes an increase in the color intensity of the recording material, a sensitizer and optionally further additive and/or auxiliary substances, and contain as the color-forming system (a) one or more colorless or virtually colorless organic compounds which are oxidizable to colored compounds, and (b) a photooxidant for the colorless or virtually colorless organic compound(s) (a), wherein photooxidant (b) comprises an organic salt with a substituted or unsubstituted hetaromatic system, this hetaromatic system having one or more built-in groups of the general formula (I)

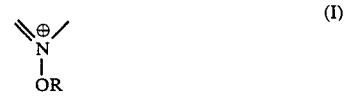

(I)

where R is substituted or unsubstituted alkenyl, alkynyl, hetaryl, alkoxycarbonyl, carbamoyl, alkylsulfonyl or arylsulfonylaminosulfinyl, substituted cycloalkyl or a substituted or unsubstituted hetaryl cation, with the proviso that the maximum of the long-wave absorption band of the salt is below 400 nm.

20 Claims, No Drawings

PHOTOPOLYMERIZABLE RECORDING MATERIALS AND PHOTORESIST LAYERS AND LITHOGRAPHIC PRINTING PLATES BASED THEREON

The present invention relates to photopolymerizable recording materials composed of one or more photopolymerizable, olefinically unsaturated organic compounds, optionally a polymeric binder, a photopolymerization initiator, a color-forming system, consisting of color former and photooxidant, and a sensitizer. They are suitable in particular for producing photoresist layers and lithographic printing plates.

Photopolymerizable recording materials for the purposes mentioned are known per se. They contain in general, besides a photopolymerizable, olefinically unsaturated organic compound, a polymeric binder and a photopolymerization initiator, a color-forming system which, or irradiation with actinic light, causes a color change in the irradiated areas. This color change is of great importance for the visual inspection and control of the recording materials following imagewise exposure. For instance, in the production of printed circuits or circuit boards by means of photoresist layers it is necessary to make sure after the imagewise exposure and before the removal of the unexposed areas from the photoresist layers that the negative was correctly emplaced. Furthermore, the color change makes it possible in the imagewise exposure of layers of photopolymerizable recording materials to check the image obtained following the development of the exposed layer and thereby make possible, for example, easy and reliable detection of any detachment of the image areas of the layer in the course of development. To permit effective visual inspection of these exposed layers, the color-forming system should on exposure bring about a very pronounced color contrast in the recording material, ideally so that the color formation gives very dark images if viewed in yellow light. Moreover, the color-forming system must be stable to storage to avoid undesirable color deepening in the photopolymerizable recording material in the time between manufacture and use.

Color-forming systems consist in general of a colorless or slightly colored dye precursor (color former) and an activator which on irradiation with actinic light converts the dye precursor into the colored compound. Suitable color formers are in particular leuco dyes or the slightly colored free bases or lactone forms of dyes. The activators for the color formers are customarily photooxidants, in particular organic halogen compounds which split off halogen free-radicals on irradiation with actinic light. Reference is made in this context to for example DE-A2,306,353, DE-A-2,718,200, EP-B-2,805, EP-B-5,379 and WO-A-80/01,846. It has also already been proposed (e.g. in German Laid-Open application DOS 3,433,026) to use azide compounds, such as 2-azidobenzoxazole, benzoyl azide and 2-azidobenzimidazole (U.S. Pat. No. 3,282,693), triazoles and heterocyclic ketimides (GB-1,030,887) and also hexaarylbisimidazoles (cf. DE-A-1,924,317 and EP-B-19,219) as photooxidants. Some of the existing photopoly-merizable recording materials, which contain in particular the last-mentioned type of photooxidant, contain in addition a sensitizer to enhance the sensitivity and to improve the photoreaction, for example a tertiary amine of an aromatic carbonyl compound, for example Michler's ketone.

The color-forming systems used in the existing photopolymerizable recording materials frequently show on imagewise irradiation of these materials with actinic light only a weak color change and insufficient contrast between exposed and unexposed areas. Nor is the storage stability of the color-forming system hitherto used for photopolymerizable recording materials satisfactory in many cases, a deepening in color being observable even on storage in the dark. Those color-forming systems which contain an organic halogen compound as activator for the color former furthermore adversely affect the processing properties of the photopolymerizable recording materials. For instance, photoresist layers produced from these recording materials are for example not completely removable from metallic substrates following imagewise exposure and development as is required for example in production of printed circuits and circuit boards, but leave behind on the substrate a more or less pronounced residual layer which interferes with the further processing of the products. Furthermore, the halogen content can lead to signs of corrosion on metallic substrates. The hexarylbisimidazoles which are also used and which, on irradiation of the photopolymerizable recording materials with actinic light, initiate both photopolymerization and photooxidation can only be produced by an expensive process and only permit the use of specific radiation sources on account of the position of the long-wave absorption maximum. Furthermore, the photopolymerization and photooxidation properties of the photopolymerizable recording material cannot be varied independently of each other without using further auxiliaries. There is therefore a need for further, improved color-forming systems for use in photopolymerizable recording materials of the type in question.

DE-A-2,046,018 describes a color form system which has been applied to a base material. These photographic, nonphotopolymerizable recording materials serve to produce colored images. There color former system consists of a colorless or virtually colorless color former which can be converted into the colored form by oxidation, and as the photooxidant a heterocyclic compound having an acyloxy- or alkoxy-substituted ring nitrogen atom. The color formers described are leuco dyes and derivatives thereof. The photooxidants mentioned are specifically substituted N-alkoxy- and N-acyloxy-pyridinium salts. By virtue of the substituents in the pyridinium radical, the long-wave absorption maximum of the activator is adapted to the particular source of radiation used, i.e. the pyridinium salt used as a photooxidant (activator) for the leuco dye preferably absorbs actinic light of a wavelength greater than 400 nm. German Laid-Open application DOS 3,433,026 likewise describes as the color former system an alkoxypyridinium salts are also claimed as photopolymerization initiators alone (cf. German Laid-Open applications DOS 1,950,746 and DOS 1,950,749, US-Re-27,925 or U.S. Pat. No. 3,574,622) or combined with a ketocoumarin as a sensitizer for actinic light of a wavelength >400 nm (cf. German Laid-Open application DOS 3,135,399). The prior art thus discloses that N-alkoxypryridinium salts can act alone as photooxidants or photopolymerization initiators and be sensitized by means of ketocoumarins. The exposure times required for obtaining a degree of polymerization deemed necessary in the prior art are not significantly different with the aforementioned initiator system from those times obtained with the industrially used polymerization initiator comprising Michler's ketone/benzophenone. The photographic recording materials described in DE-A-2,046,018 give on exposure to actinic light only a relatively weak color change and/or require for a stronger contrast between exposed and unexposed areas significantly longer exposure times than are acceptable for photopolymerizable recording materials.

It is an object of the present invention to provide photopolymerizable recording materials which incorporate a good color former system and which overcome the disadvantages of prior art products, i.e. which are simple and easy to obtain, which in the relatively short exposure times required for photopolymerizable recording materials show on exposure to actinic light a large color change to produce a crisp and marked contrast between exposed and unexposed areas, which are highly stable to storage and which do not leave a residual layer or metallic substrates.

We have found, surprisingly, that this object is better achieved with specific photooxidants.

The present invention accordingly provides a photopolymerizable recording material composed of one or more photopolymerizable olefinically unsaturated organic compounds, optionally a polymeric binder, one or more photopolymerization initiators, a color-forming system which on irradiation with actinic light causes an increase in the color intensity of the recording material, a sensitizer and optionally further additive and/or auxiliary substances, which contains as the color-forming system (a) one or more colorless or virtually colorless organic compounds which are oxidizable to colored compounds, and (b) a photooxidant for the colorless or virtually colorless organic compounds(s) (a), wherein photooxidant (b) comprises an organic salt with a substituted or unsubstituted hetaromatic system, this hetaromatic system having one or more built-in groups of the general formula (I)

(I)

where R is substituted or unsubstituted alkenyl, alkynyl, hetaryl, alkenecarbonyl, alkynecarbonyl, alkoxycarbonyl, carbamoyl, alkylsulfonyl or arylsulfonylaminosulfinyl, substituted cycloalkyl or a substituted or unsubstituted hetaryl cation, with the proviso that the maximum of the long-wave absorption band of the salt is below 400 nm.

The present invention also provides in particular a recording material where the sensitizer comprises a compound of the general formula (III)

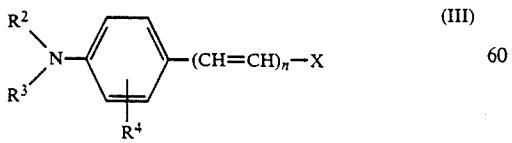
(III)

where $R^2$ and $R^3$ can be identical or different and each is substituted or unsubstituted alkyl of 1 of 6 carbon atoms, phenyl or aralkyl. $R^2$ and $R^3$ can also be bonded to each other to form a nonaromatic ring, $R^4$ is hydrogen or alkyl, X is substituted or unsubstituted benzoyl or a substituted or unsubstituted hetaromatic ring system, and n is either 0, 1 or 2.

Photooxidants (b) present according to the invention in the color-forming system of the photopolymerizable recording materials can be organic salts of the type defined above. The term salt as used herein also includes inner salts, i.e. ionic compounds where the cationic and anionic groups are linked to each other by covalent bonds. A suitable hetaromatic system in these salts which contains one or more groups of the above-mentioned general formula (I) comprises in particular six-membered hetaromatic rings containing 1, 2 or even 3 ring nitrogen atoms and the ring-substituted derivatives thereof, including the benzofused and hetarylfused representatives. Examples of ring substituents for these hetaromatic systems are: alkyl groups, in particular of 1 to 6 carbon atoms, e.g. methyl, ethyl, propyl and n-butyl, substituted alkyl groups, e.g. halogen-substituted alkyl of 1 to 6 carbon atoms, aralkyl, in particular benzyl, alkyl substituted by anionic groups, e.g. alkylidenesulfonate, OH, amide and carboxyl, vinyl or styryl, phenyl, substituted phenyl, halogen atoms, preferably chlorine, nitro, alkoxy, preferably of 1 to 6 carbon atoms, for example methoxy, formyl, dialkylamino, diarylamino, alkylthio and arylthio and the like. Examples of R in the group of the above-mentioned general formula (I) are inter alia substituted or unsubstituted cycloalkyl, e.g. cyclohexyl or 2-hydroxylcyclohexyl, aralkyl, in particular benzyl, or alkyl containing anionic groups, e.g. alkylidenesulfonate, phenyl, aryl and hetaryl (an N- and/or S-containing 5- or 6-membered heterocyclic ring). Further examples of R in the general formula (I) are alkoxycarbonyl (formula IV), N-carbamoyl (formula V), N-alkylsulfonyl (formula VI), arylsulfonylaminosulfinyl (formula VII) and the pyridinium cation of the formula (VIII),

(IV)

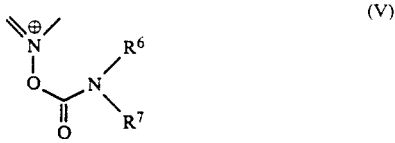
(V)

(VI)

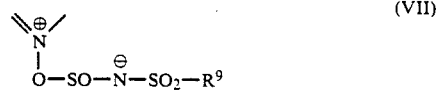
(VII)

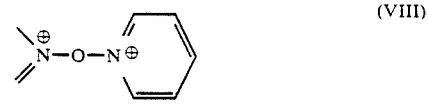
(VIII)

where for example:

$R^5$ is straight-chain or branched alkyl, preferably of 1 to 6 carbon atoms, e.g. methyl, ethyl, propyl, in particular i-butyl, substituted alkyl, e.g. halogen-substituted alkyl, in particular 1,1,1-trichloroethyl, $R^6$ and $R^7$ can be identical or different and each is straight-chain or branched alkyl, e.g. methyl, ethyl, i-propyl or n-butyl. $R^6$ and $R^7$ can also be linked with each other by $CH_2$ groups, although one $CH_2$ unit can also be replaced by hetero atoms, e.g. substituted nitrogen or oxygen. In particular, $R^6$ and $R^7$ would then be $(CH_2)_2$—O—$(CH_2)_2$;

$R^8$ is alkyl and halogen-substituted alkyl, e.g. trifluoromethyl;

$R^9$ is phenyl, aryl, alkyl or halogen-substituted aryl.

It is also possible to use the ring substituents on the hetaromatic system or the radical R in the group of the abovementioned general formula (I) to join together two hetaromatic systems which contain the group of the general formula (I). The salts to be used according to the invention as photooxidants (b) can be present as inner salts or contain as the anion the anions of inorganic or organic acids, e.g. chloride, bromide, iodide, hydrogensulfate, fluorosulfonate, perchlorate, tetrafluoroborate, hexafluorophosphate, hexachloroantimonate, hexafluoroarsenate, alkylsulfonates, trifluoromethanesulfonate, methylsulfate, methylsulfite, benzenesulfonate, substituted benzenesulfonates, e.g. p-toluenesulfonate.

By proper selection of the ring substitution in the hetaromatic system and/or the radical R in the group of the general formula (I) it is possible to affect and vary the activity on irradiation with actinic light and the thermal and chemical stability of photooxidants (b) to be used according to the invention. In addition, the anions in photooxidants (b) to be used according to the invention also have an effect on the properties of the photopolymerizable recording materials. Customarily and advantageously, the photoxidant (b) is chosen in such a way that its molar extinction coefficient E in the wavelength range from 300 to 420 nm, in particular in the range from 320 to 400 nm, is smaller than that of the sensitizer also present in the photopolymerizable recording materials according to the invention for photooxidant (b) and, if present, of the sensitizer for the photopolymerization initiator.

The salts to be used according to the invention as photooxidants (b) include in particular those pyridinium, pyrazinium and pyrimidinium salts which contain a group of the abovementioned general formula (XII) built in the hetaromatic ring, and also the ring-substituted derivatives thereof which contain one or more ring substituents of the abovementioned kind in the hetaromatic ring, and also fused derivatives thereof, for example benzofused pyridinium salts of the type in question, such as for example the corresponding unsubstituted or ring-substituted quiolinium, isoquinolinium or phenanthridinium salts. Preferred meanings of R in the group of the general formula (I) are in particular alkenylcarbonyl, alkynylcarbonyl, alkoxycarbonyl, carbamoyl, alkylsulfonyl and arylsulfonylaminosulfinyl. Preferred ring substituents for these salts include in particular substituted or unsubstituted alkyl. Preferred anions for these salts are inter alia chloride,' perchlorate, benzenesulfonate, tosylate, alkylsulfonate, trifluoromethanesulfonate or tetrafluoroborate anions.

The salts to be used according to the invention as photooxidants (b) include for example compounds of the following general formulae (II), (IX) to (XVII):

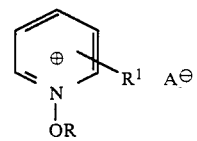

(II)

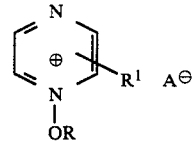

(IX)

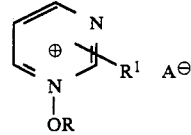

(X)

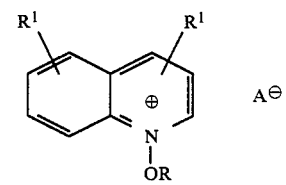

(XI)

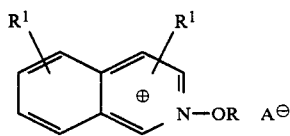

(XII)

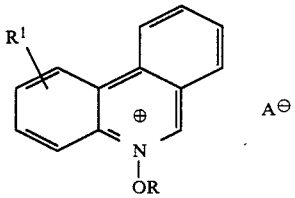

(XIII)

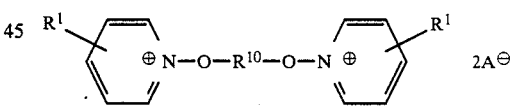

(XIV)

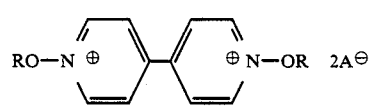

(XV)

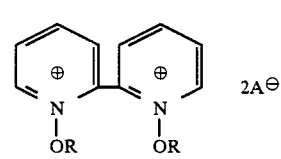

(XVI)

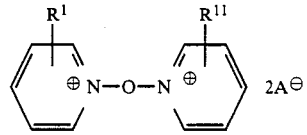

(XVII)

in the formulae (II), (IX) to (XVI), R is as defined above in connection with the general formula (I), although in the compounds of the general formulae (II), (IX) to (XVI) R is preferably substituted cyclohexyl, e.g. 2-hydroxycyclohexyl, alkoxycarbonyl of the formula (IV), where $R^5$ is preferably 1,1,1-trichloroethyl, carbamoyl of the formula (V), where $R^6$ and $R^7$ are preferably identical to each other and can be methyl, ethyl, i-propyl or n-butyl and $R^6$-N-$R^7$ can also be morpholino. In the formulae (II), (IX) to (XVI), R can further be alkylsulfonyl of (VI), where $R^8$ is preferably trifluoromethyl, or alkylsulfonylaminosulfinyl of the formula (VII).

In these formulae $R^1$ is hydrogen (corresponding to an unsubstituted hetaromatic ring) or one or more ring substituents of the abovementioned type, preferably hydrogen or one or more, substituted or unsubstituted, alkyl, aryl, dialkylamino, diarylamino, alkylthio, arylthio, alkoxy or chlorine. In particular, $R^1$ is hydrogen or one or more methyl, preferably 2-methyl, 2,6-dimethyl, or in the general formulae (II), (IX) and (XVI), even 3,5-dimethyl. In the formula (XIV), $R^{10}$ is alkylidene, in particular of 2 to 6 carbon atoms or xylidene, e.g. p-xylidene. In the formula (XVII), $R^{11}$ is preferably hydrogen. Furthermore, in the formulae (II) and (IX) to (XVII) $A^\ominus$ is an acid anion, in particular of the type mentioned above. Preferred acid anions for the compounds of the general formulae (II) and (IX) to (XVII) are the benzenesulfonate, toluenesulfonate, methylsulfonate, n-octylsulfonate, tetrafluoroborate, hexafluorophosphate and trifuloromethanesulfonate anion. Where one of the radicals R or $R^1$ contains an anion group, for example a sulfonate group, it is of course the case that the anion $A^\ominus$ disappears in the general formulae (II) and (IX) to (XVII).

of the salts to be used according to the invention as photooxidants (b), compounds of the general formula (II) are of particular importance, particularly good utility being possessed specifically by those compounds where $R^1$ is hydrogen or one or two methyls.

Examples of compounds which according to the invention are usable as photooxidants (b) in the photopolymerizable recording materials are: 1-(acryloyloxy)-pyridinium chloride, 1-(methacryloyloxy)pyridinium chloride, 1-(isobutoxycarbonyloxy)pyridinium chloride, 1-(isobutoxycarbonloxy)-2-picolinium chloride, 1-(isobutoxycarbonyloxy)-3-picolinium chloride, 1-(isobutoxycarbonyloxy)-4-picolinium chloride, 1-(isobutoxycarbonyloxy)-2,6-dimethylpyridinium chloride, 1-(α,α,α-trichloroethoxycarbonyloxy)pyridinium chloride, 1-(N,N-dimethylcarbamoyloxy)pyridinium chloride, 1-(N-morpholinocarbonyloxy)pyridinium chloride, 1-(N-morpholinocarbonyloxy)pyridinium tetrafluoroborate, 1-(N-morpholinocarbonyloxy)-pyridinium hexafluorophosphate, 1-(N-morpholinocarboxyloxy)-2,6-dimethylpyridinium chloride, 1-(N-morpholinocarbonyloxy)-3,5-dimethylpyridinium chloride, 1-(trifluoromethylsulfonyloxy)pyridinium trifluoromethanesulfonate, 1-(benzenesulfonylaminosulfinyloxy)pyridiniumbetaine, 1-(N-pyridiniumoxy)pyridinium bistrifluoromethanesulfonate.

The salts of the abovementioned kind to be used according to the invention as photooxidants (b) can be prepared in a conventional manner. Reference may be made in this context for example to R. A. Abramovitch and E. M. Smith in Pyridine and its Derivatives, volume 14 supplement, part 2, J. Wiley, New York (1974).

The color-forming system present in the photopolymerizable recording materials according to the invention, which on irradiation of the recording materials with actinic light causes an increase in the color intensity in these materials, contains besides photooxidant (b) of the aforementioned type one or more colorless or virtually colorless organic compounds (a) which are oxidizable to colored compounds. These color-forming, initially colorless or virtually colorless organic compounds (a) will hereinafter also be referred to as color formers (a). Suitable color formers (a) are in particular leuco dyes, a leuco dye being the reduced form of a dye and having in general 1 to 2 hydrogen atoms whose removal, together with one or two electrons leads to generation of the dye. These leuco dyes are essentially colorless or are at most slightly colored in a low-intensity color which is appreciably different from the color of the actual dye (oxidized form). Suitable leuco dyes are in particular the diarylmethane and triarylmethane dyes in their leuco form and the leuco forms of dyes having a triarylmethane structure where two of the aryl radicals are linked with each other by an N, S or O atom. This includes inter alia the leuco form of aminoacridine dyes, of aminoxanthene dyes and of aminothioxanthene dyes. Also suitable are leuco dyes of the triarylmethane type where one dialkyl- or alkylarylaminophenyl radical has been replaced by an N-alkyl-substituted carbazolyl group, as described, for example, in U.S. Pat. No. 4,154,463. Color formers (a) can also be for example leucomethines. Leuco dyes which are suitable for use as color formers (a) for the photopolymerizable recording materials according to the invention are described for example in U.S. Pat. No. 3,552,973. Of particular interest here are leucotriarylmethane dyes, e.g. leuco crystal violet, leuco malachite green, leuco basic blue, leuco pararosaniline and leuco patent blue A or V.

The ratio of color former (a) and photooxidant (b) in the photopolymerizable recording materials has to be chosen in such a way as to ensure in all cases a sufficient color change or irradiation with actinic light. It is usually found to be sensible to use photooxidant (b) in a small excess (by weight) compared with color former (a). As for the rest, quantities and mixing ratios of color former (a) and photooxidant (b) are selected in such a way in a conventional manner that the photopolymerizable recording materials meet the state requirements in respect of exposure time, color contrast etc.

Besides a color-forming system of the type described above, the photopolymerizable recording materials according to the invention contain one or more photopolymerizable, olefinically unsaturated organic compounds, optionally a polymeric binder, one or more photopolymerization initiators, one or more sensitizers and optionally further additive and/or auxiliary substances. These further constituents of the photopolymerizable recording materials according to the invention can be the compounds used in conventional photopolymerizable compositions as used for producing overcoats, printed plates, photoresist materials and the like and described for example in the references cited at the beginning.

The photopolymerizable, olefinically unsaturated organic compounds can be olefinically unsaturated monomers, olefinically unsaturated oligomers and/or polymers containing photopolymerizable, olefinic double bonds. The photopolymerizable, olefinically unsaturated organic compounds contain preferably vinylic double bonds, in particular vinyl groups activated by conjugation and/or adjacency to O or N atoms. This includes in particular those vinyl groups adjacent to ester or amide groups, e.g. acryloyl and methacryloyl groups. The photopolymerizable, olefinically unsaturated organic compounds can be not only monofunctional but also polyfunctional, i.e. they can possess one or indeed more than one photopolymerizable olefinic double bond. Customarily, the photopolymerizable recording materials contain bifunctional or polyfunctional olefinically unsaturated, photopolymerizable compounds alone or mixtures thereof with monofunctional olefinically unsaturated photopolymerizable compounds. The photopolymerizable olefinically unsaturated monomers have in general a molecular weight of up to about 1,000. The number average molecular weight of the photopolymerizable olefinically unsaturated oligomers is preferably within the range from 1,000 to 10,000, in particular from about 1,500 to 6,000. The weight average molecular weight of the polymers containing photopolymerizable olefinic double bonds is in general above 15,000. The photopolymerizable, olefinically unsaturated organic compounds can be used alone or mixed with each other. The nature and amount of the photopolymerizable, olefinically unsaturated organic compounds used depend largely on the intended application of the photopolymerizable recording materials and on the nature of the other constituents used.

Representatives of photopolymerizable monomers are in particular the derivatives of (meth)acrylic acid, specifically (meth)acrylic esters. Examples thereof are di- and tri-(meth)acrylates of ethylene glycol, diethylene glycol, triethylene glycol or polyethylene glycols having a molecular weight of up to about 500, 1,2-propanediol, 1,3-propanediol, polypropylene glycols having a molecular weight of up to about 500, 1,4-butanediol, 1,6-hexanediol, 1,1,1-trimethylolpropane, 2,2-dimethylpropanediol, glycerol or pentaerythritol, pentaerythritol tetra(meth)acrylate, glucose tri- or tera-(meth)acrylate, and also the monoacrylates and monomethacrylates of the diols and polyols mentioned, e.g. ethylene glycol di-, tri- or tetraethylene glycol mono(meth)acrylate, propanediol mono(meth)acrylate and butanediol mono(meth)acrylate, similarly the (meth)arcylates of monoalkanols, in particular of those having 1 to 20 carbon atoms. Aside from the preferred acrylates and methacrylates of the aforementioned kind, suitable photopolymerizable monomers also include allyl compounds and other vinyl compounds, e.g. N-vinylpyrrolidone, N-vinylcaprolactam, vinyl acetate, vinyl propionate, (meth)acrylamide, N-methylol (meth)acrylamide, the bisether of ethylene glycol and N-methylol (meth)acrylamide, vinyl carbamates, bisacrylamidoacetic acid, glyoxalbisamide and the like.

Highly suitable photopolymerizable, olefinically unsaturated organic compounds for the photopolymerizable recording materials according to the invention also include monomeric urethane acrylates or methacrylates having two or more acryloyl and/or methacryloyl groups. Such monomeric urethane (meth)acrylates can be obtained for example by reacting aliphatic di- or polyols with organic diisocyanates in an equivalent ratio OH:NCO of about 1:2 and subsequent reaction of the free isocyanate groups of the reaction products obtained with suitable acryloyl and/or methacryloyl compounds, for example hydroxyalkyl (meth)acrylates. Suitable aliphatic di- and/or polyols are inter alia the dihydroxy and polyhydroxy compounds mentioned above in connection with di- and tri-(meth)acrylates; examples of organic diisocyanates are hexamethylene diisocyanate, toluylene diisocyanate, isophorone diisocyanate and the like: hydroxyalkyl (meth)acrylates are for example hydroxyethyl (meth)acrylate, propanediol mono(meth)acrylate and butanediol mono(meth)acrylate. Similarly suitable and advantageous are monomers having two or more acryloyl and/or methacryloyl groups, as can be obtained for example by reacting di- or polyglycidyl compounds with acrylic acid and/or methacrylic acid or by reacting glycidyl (meth)acrylate with di- or polyols, in particular aliphatic di- or polyols, as mentioned above for example in connection with di- and tri(meth)acrylates. Suitable di- and polyglycidyl compounds here are in particular the di- and polyglycidyl ethers of polyhdric aliphatic alcohols or of polyhydric phenols, for example of bisphenol A or of substitution products thereof. Examples of such acryloyl- and/or methacryloylcontaining monomers are the reaction products of bisphenol A bisglycidyl ether with acrylic and/or methacrylic acid in a molar ratio of about 1:2, and 1,6-hexanediol bisglycidyl ether bismethacrylate.

It has proved advantageous, in particular for the production of photoresist layers, if the photopolymerizable, olefinically unsaturated organic compounds in the photopolymerizable recording materials are oligomers having two or preferably more than two acryloyl and/or methacryloyl groups. They can comprise for example acryloyl- and/or methacryloyl-containing oligomericurethane resins or those based on di- or polyepoxies as disclosed and described as such in the literature. For aqueously developable photopolymerizable recording materials, those oligomers of the type in question are of particular interest here which, besides acryloyl and/or methacryloyl groups, additionally contain free carboxyl groups in the molecule. The proportion of free carboxyl groups in these photopolymerizable oligomers is advantageously sufficiently high for the oligomers to have an acid number within the range from 50 to 150 mg of KOH/g. Suitable photopolymerizable oligomers of this type are described for example in DE-A-2,442,527, DE-C-2,557,408 or else DE-A-2,917,483. Further photopolymerizable oligomers whose use in the photopolymerizable recording materials according to the invention has proved to be advantageou scan be prepared for example by reacting the free hydroxyl groups of an acryloyl- and/or methacryloyl-containing diol or polyol compound with polybasic carboxylic acids or derivatives thereof, in particular cyclic carboxylic anhydrides, in such a way as to form the acidic partial esters of the polybasic carboxylic acids and subsequently reacting a proportion of the free carboxyl groups on the reaction product thus obtained with diepoxies and/or polyepoxies to give chain extension with or without branching. The acryloyl- and/or methacryloyl-containing diol or polyol compounds which serve as the starting material for preparing such oligomers are advantageously prepared by reacting diepoxy or polyepoxy compounds, for example diglycidyl or polyglycidyl ethers or diglycidyl or polyglycidyl esters, with acrylic acid and/or methacrylic acid in an equivalent ratio of glycidyl groups:COOH groups of about 1:1. The diepoxy or polyepoxy compounds can also, for example, be extened before or during the reaction with (meth)acrylic acid by reaction with dicarboxylic acids. Representative examples of such oligomers of the last kind are those products obtainable by reacting bisphenol A bisglycidyl ether with acrylic and/or methacrylic acid or a mixture of from about 30 to 70 mol % of a dicarboxylic acid, for example adipic acid, and from about 30 to 70 mol % of acrylic and/or methacrylic acid in a equivalent ratio of glycidyl groups:total COOH of 1:1, reacting the hydroxyl groups of the reaction product thus obtained with a cyclic dicarboxylic anhydride, for example phthalic anhydride, alone or in admixture with a minor amount of the anhydride of another polybasic carboxylic acid, for example trimellitic anhydride, in an equivalent ratio of OH groups:anhydride groups of 1:1 to form the acidic partial ester of the polybasic carboxylic acid, and finally reacting a proportion of the free carboxyl groups of the reaction product thus obtained with a diglycidyl and/or polyglycidyl ether, for example bisphenol A bisglycidyl ether or pentaerythritol glycidyl ether in an equivalent ratio of COOH groups:glycidyl groups of >1:1, preferably in the range from about 1.15:1 to 5:1.

Examples of polymers containing photopolymerizable olefinic double bonds are those light-sensitive polymers described for example in DE-A-1,522,359.

It will be readily understood by those skilled in the art that the photopolymerizable, olefinically unsaturated organic compounds, which customarily have a boiling point of above 100° C. under atmospheric pressure, have to be selected in such a way that they are compatible with the other constituents of the photopolymerizable recording materials, in particular any polymeric binders used.

The preferred photopolymerizable recording materials, besides the photopolymerizable, olefinically unsaturaated organic compounds, contain pollymeric binders, in particular if the photopolymerizable, olefinically unsaturated organic compounds present exclusively comprise photopolymerizabe monomers and/or photopolymerizable oligimers. These polymeric binders should be soluble or at least dispersible in the developer solvents for the photopolymerizable recording materials to make it possible to wash out the unexposed and uncrosslinked areas of the layer from these materials after imagewise exposure to actinic light. Examples of suitable polymeric binders are: linear polyamides and in particular alcohol-soluble copolyamides as described in French Pat. No. 1,520,856, cellulose derivatives, in particular those which can be washed out with aqueous alkaline developers, vinyl alcohol polymers and polymers and copolymers of vinyl esters of aliphatic monocarboxylic acids of 1 to 4 carbon atoms, as of vinyl acetate, having different degrees of hydrolysis, homopolymers and copolymers of vinylpyrrolidone, of vinyl chloride or of styrene, polyurethanes and polyether urethanes, polyester urethanes, polyester resins, diene polymers and copolymers, such as block copolymers of butadiene and/or isoprene and styrene or α-methylstyrene, but also, in particular for the production of photoresist layers and lithographic printing plates, alkyl acrylate and methacrylate polymers and copolymers. Examples of suitable and preferred polymeric binders are inter alia polymethacrylate, polymethyl methacrylate, alkyl (meth)acrylate copolymers which contain amino-containing comonomers, e.g. dimethylaminoethyl metharylate, in polymerized form, copolymers of alkyl (meth)acrylates and (meth)acrylic acid which may contain still further comonomers, e.g. N-vinyllactams, hydroxyalkyl (meth)acrylates or styrene, in polymerized form, copolymers of styrene and maleic anhydride and/or maleic half-esters or even copolymers of styrene, maleic anhydride and (meth)acrylic acid.

The photopolymerizable recording materials according to the invention further contain, in addition to photooxidant (b) of the color-forming system, as further light-sensitive component one or more photopolymerization initiators which are capable under the influence of actinic light of initiating the free radical polymerization of the photopolymerizable, olefinically unsaturated organic compounds in the photopolymerizable recording materials. Of particular advantage here are those aromatic carbonyl compounds known for use as photoinitiators, in particular aromatic ketones which have a structural unit of the general formula (XVIII)

where Ar is substituted or unsubstituted aryl, in particular substituted or unsubstituted phenyl. The two Ar's in the structural unit of the general formula (XVIII) can be identical or different and may also be linked to each other, for example via a —CH— group or an —S— atom. Preferably, the photopolymerization initiators selected have no strong absorption ($\epsilon<5000$) in the wavelength range of the actinic light in which the sensitizers present in the photopolymerizable recording materials according to the invention have their absorption band(s). Specific examples of preferred photopolymerization initiators are: benzophenone, substituted benzophenones, such as 4,4'-dichlorobenzophenone, polynuclear unsubstituted or substituted quinones, such as anthraquinone, benzanthraquinone, 2-ethylanthraquinone or tert-butylanthraquinone and thioxanthones, e.g. 2-methyl thioxanthone and 2-chlorothioxanthone.

The photopolymerizable recording materials according to the invention contain in addition one or more sensitizers in the wider sense, i.e. a compound which on irradiation of the photopolymerizable recording materials with actinic light activates the photooxidant (b) and/or the photopolymerization initiator. Suitable sensitizers for the photopolymerizable recording materials according to the invention are in particular electron-rich aromatic compounds. Preferably, the sensitizers are tertiary aromatic amines, in particular those in which the aminophenyl radical is bonded to a carbonyl radical, in particular an aromatic carbonyl radical, in such a way that the double bonds are conjugated with each other. They include for example aromatic amines of the general formula (III).

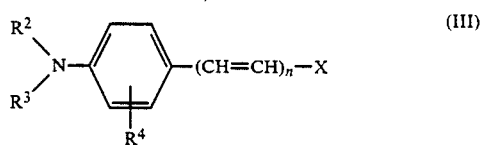

where $R^2$ and $R^3$ can be identical or different and each is substituted or unsubstituted alkyl or 1 to 6 carbon atoms, phenyl or aralkyl, $R^2$ and $R^3$ can also be bonded together to form a nonaromatic ring, $R^4$ is preferably hydrogen or alkyl, n is either 0, 1 or 2 and X is substituted or unsubstituted benzoyl or a substituted or unsubstituted, hetaromatic ring system, for example a possibly substituted and/or benzofused pyridine, diazole, triazole, thiazole, oxazole, thiadiazole or oxadiazole ring. Examples of the radical X in the sensitizers of the general formula (III) are the following radical:

| | | |
|---|---|---|
| (1) | 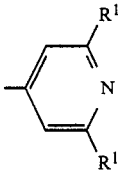 | with $R^{12}$, $R^{13}$ (identical or different and independently of each other) = H, alkyl of 1 to 6 carbon atoms or unsubstituted or halogen-, alkyl- or alkoxy-substituted aryl, |
| (2) | 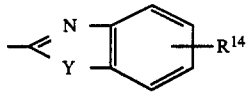 | with Y = O, S, Se or $NR^{15}$ (with $R^{15}$: H, alkyl or phenyl) and $R^{14}$ = H, alkyl, alkoxy or phenyl, |
| (3) | 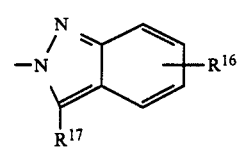 | with $R^{16}$ = H or Cl and $R^{17}$ = H, $NH_2$ or dialkylamino, |
| (4) | 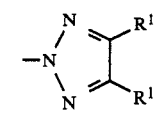 | with $R^{18}$, $R^{19}$ (identical or different and independently of each other) = alkyl, alkenyl, carbalkoxy, unsubstituted or halogen-, alkyl- or alkyoxy-substituted phenyl or $R^{18}$ and $R^{19}$ together form a saturated 5- or 6-ring, |
| (5) | 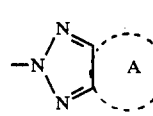 | with A = the radical for com-completing an aromatically unsaturated carbocyclic or heterocyclic ring system eg. benzene, naphthalene or pyrazole, this ring system being unsubstituted or substituted by halogen, alkyl or alkoxy, |
| (6) | 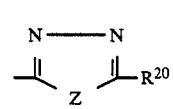 | with Z = O, S or $NR^{21}$ (with $R^{21}$ = H, alkyl or phenyl), $R^{20}$ = H, alkyl, unsubstituted or alkyl-, alkoxy- or dialkylamino-substituted phenyl, naphthyl or biphenyl, |
| (7) | 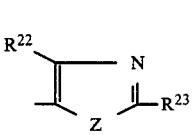 | with Z = O, S or $NR^{24}$ (with $R^{24}$ = H, alkyl or phenyl), $R^{22}$ = H, alkyl or unsubstituted or substituted phenyl and $R^{23}$ = H, alkyl, unsubstituted or alkyl-, alkoxy- or dialkylamino-substituted phenyl, naphthyl, biphenyl or vinyl, |
| (8) | 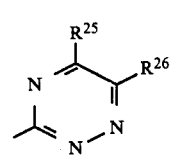 | with $R^{25}$, $R^{26}$ = 5- or 6-membered aromatic or hetaromatic ring systems which can be substituted by alkyl or alkoxyl. |

Preferred sensitizers for the photopolymerizable recording materials according to the invention are those of the general formula (III) where X has one of the following meanings (=O):

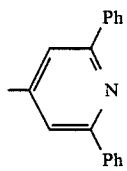 (9)

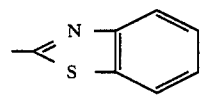 (10)

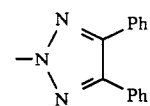 (11)

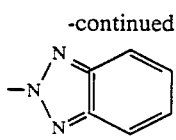 (12)

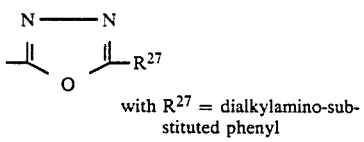 (13)

with $R^{27}$ = dialkylamino-substituted phenyl

Examples of suitable and preferred sensitizers are inter alia 2,5-bis-(4'-diethylaminophenyl)-1,3,4-oxadiazole, 2-(4'-diethylaminophenyl)-1,2,3-benzotriazole, 2-(4'-diethylaminophenyl)-4,5-diphenyl-1,2,3-triazole, 2-(4-dimethylaminophenyl)benzothiazole, 2-(4-dimethylaminophenyl)benzoxazole, 2-(4-dimethylaminostryl)benzothiazole and 2-(4-diethylaminostyryl)naphtho(1,2)thiazole.

X can also be unsubstituted or preferably substituted benzoyl of the type

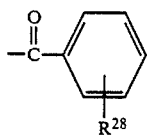

where $R^{28}$ is H, alkyl, cycloalkyl, hydroxyalkyl, hydroxyl, Cl, Br, alkoxy, alkylthio, dialkylamino or diarylamino, preferably in the p-position. Preferred compounds are those where the benzoyl radical is

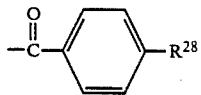

where $R^{28}$ is dialkylamino or diarylamino. Preferred sensitizers of this category are inter alia 4-dimethylaminobenzophenone, 4,4'-bis(dimethylamino)benzophenone, 4,4'-bis(diethylamino)benzophenone and 4,4'bis(hydroxyethylmethylamino)benzophenone.

The color-forming system incorporating the photooxidants (b) to be used according to the invention surprisingly bring about, together with the sensitizers of the type defined above, in the photopolymerizable recording materials according to the invention a very substantial increase in color intensity and contrast formation even in the relatively short exposure times to actinic light required for photopolymerizable recording materials.

Besides the constituents mentioned, the photopolymerizable recording materials according to the invention may also contain further customary additive and/or auxiliary substances which improve and/or modify the processing and/or application properties of the recording materials. These substances include inter alia thermal polymerization inhibitors, inorganic or organic pigments or dyes which can act not only as contrast aids but also as layer consolidants, low molecular weight adhesion promoters, flow control agents, delusterants, lubricants, plasticizers and the like.

The constituents of the photopolymerizable recording materials according to the invention are used in the customary amounts and mixing ratios and are present in the recording materials in homogeneous mixture. To prepare the photopolymerizable recording materials, the constituents are homogeneously mixed with one another in a conventional manner, for example in solution in a suitable solvent or solvent mixture or in a mixing apparatus, such as a kneader, extruder or the like. Preferably, the nature and the quantity of the individual constituents of the photopolymerizable recording materials according to the invention are adapted to one another in such a way that the resulting mixture is solid (after removal of solvent, if the mixture was prepared in solution).

The photopolymerization and the color formation or the deepening of the color intensity in the photopolymerizable recording materials according to the invention are triggered using actinic light of wavelengths of from 300 to 420 nm, in particular of from 320 to 400 nm. Suitable sources of radiation are inter alia freely available high pressure mercury lamps, medium pressure mercury lamps, low pressure mercury lamps, superactinic fluorescent tubes, pulsed xenon lamps, UV fluorescent tubes and the like.

The recording materials according to the invention can be processed in a conventional manner into UV-curable overcoats, photopolymer printing plates of any kind, relief forms, photoresists and the like. They are particularly advantageous wherever irradiation with actinic light is to bring about not only efficient photopolymerization in the exposed areas but also a very big change in the color intensity and a very big color contrast, as for example in light-sensitive recording elements having a thin layer of the photopolymerizable recording materials according to the invention mounted on a base material, in particular dry film resists for dry layer transfer and lithographic printing plates. Suitable base materials for these light-sensitive recording elements are the dimensionally stable, preferably flexible, materials customary for this purpose, such as plastic films or foils and metal sheets. Proven base materials for dry film resists are in particular polyester foils, made for example of polyethylene terephthalate or polybutylene terephthalate. Lithographic printing plate base materials comprise in particular offset aluminum sheets whose surface has been mechanically, chemically and/or electrochemically roughened and pretreated in a conventional manner. The thin layer of photopolymerizable recording material according to the invention, the thickness of which for dry film resists is customarily within the range from about 10 to 100 μm, in particular within the range from about 15 to 70 μm, and for lithographic printing plates is customarily within the range from about 1 to 6 μm, is applied to the base materials using an existing application technique, for example casting from solution, spincoating or the like.

To produce lithographic printing forms, the lithographic printing plates produced using the photopolymerizable recording materials according to the invention are subjected in a conventional manner to imagewise exposure with actinic light and developed by washing out with a suitable developer solvent. To produce imagewise structured resist patterns, the photopolymerizable recording material according to the invention is applied in layer form to the substrate to be protected or to be permanently modified, either directly, for example from solution, or by laminating on a prefabricated layer by the layer transfer method using a dry film resist. Suitable substrates, given that the nature of the substrate is known to depend on the particular application intended for the resist pattern to be produced, are the materials customary and known in this area, for example copper sheets or copper-clad base materials. To produce the imagewise structured resist pattern, the photoresist layer of photopolymerizable recording material according to the invention applied to the substrate is subjected to imagewise exposure with actinic light and then developed to remove the unexposed areas of the layer with a suitable washout developer solvent. The imagewise exposure of the photopolymerizable recording materials according to the invention can be effected with actinic light within the aforementioned wavelength range. The nature of the washout developer solvent depends on the constituents used for the buildup of the photopolymerizable recording materials according to the invention, in particular on the polymeric binder used and/or the photopolymerizable, olefinically unsaturated organic compounds. Accordingly, it is possible to use not only organic solvents or solvent mixtures but also aqueous developers solutions.

The color-forming system in the photopolymerizable recording materials according to the invention is of high stability. The photopolymerizable recording materials therefore show excellent dark storability without the addition of large amounts of a thermal inhibitor, as is necessary with prior art products. On exposure to actinic light the photopolymerizable recording materials according to the invention, which contain in the color-forming system the readily accessible photooxidant to be used according to the invention, show an unexpectedly large increase in color intensity and a stronger color contrast between exposed and unexposed areas than is obtained with comparable prior art products where the photooxidant is, for example, an organic halogen compound. This is completely surprising, in particular since the prior art photographic recording materials based on a similar color-forming system where, however, compared with the photopolymerizable recording materials according to the invention, no photopolymerizable organic compounds, photoinitiators and sensitizers are present, show only a relatively weak color change within comparable exposure times. Effectively, the use of the photooxidants to be used according to the invention in the photopolymerizable recording materials has no adverse effect on the other application properties important for the production and use of these recording materials. On the contrary, the materials according to the invention frequently even have somewhat better exposure properties. Moreover, the photopolymerizable recording materials according to the invention are surprisingly a solution to the residual layer problem, i.e. the layers produced from the photopolymerizable recording materials according to the invention, subjected to imagewise exposure and developed are removable again from the substrate without leaving any residue even after a prolonged period by stripping with a solvent. This is of great importance in particular for the use as a photoresist, for example in the production of circuit boards and integrated circuits.

The invention is further illustrated by the Examples which follow. The parts and percentages in the Examples and Comparisons are by weight, unless otherwise stated.

EXAMPLES 1 to 6

A homogeneous mixture is prepared with stirring from the following constituents:

250 parts of 1:1 ethyl acetate/methanol,
40 parts of an oligomer containing methacryloyl and free carboxyl groups and prepared from bisphenol A bisglycidyl ether, phthalic anhydride and glycidyl methacrylate,
13.4 parts of trimethylolpropanetriacrylate,
11 parts of hexanediol bisglycidyl ether bismethacrylate,
29 parts of a polymer of 60% of methyl methacrylate, 30% of N-vinylpyrrolidone and 10% of methacrylic acid,
3.4 parts of benzophenone,
0.1 part of sensitizer,
0.5 part of leuco crystal violet
2.5 parts of photooxidant and
0.05 part of Sicomet Patent Blue After filtration through a suction filter the solution was cast onto a copper sheet in such a thickness that the dry film thickness after solvent flashoff and drying was 38 μm. The optical density of the layer was then measured.

To produce a resist pattern the photopolymerizable resist layer was subjected to a 30-second exposure in a flat exposure unit at a wavelength of 360 nm through a photographic negative showing the traces of conducting paths and then the unexposed areas of the layer were washed out with an aqueous sodium bicarbonate solution.

The bared areas of copper sheet were etched in a commercial etching bath. Afterwards the resist layer, even after 3 days, was completely strippable from the copper substrate at 50° C. with a 3% strength KOH solution without leaving a residual coating.

The optical density (OD) of the mixture was measured at 950 nm before and after exposure:

| Example | Photooxidant | Sensitizer | Optical density before exposure | after | ΔOD |
|---|---|---|---|---|---|
| 1* | A | D | 0.08 | 0.63 | 0.55 |
| 2 | B | E | 0.10 | 0.73 | 0.63 |
| 3 | B | F | 0.13 | 0.80 | 0.67 |
| 4 | B | D | 0.12 | 0.80 | 0.68 |
| 5 | C | D | 0.08 | 1.10 | 1.02 |
| 6 | C | G | 0.07 | 1.06 | 0.99 |

*For comparison with German Laid-Open Application DOS 3,135,399 Photooxidants
A: 1-methoxy-2-picolinium p-toluenesulfonate
B: 1-(isobutoxycarbonyloxy)-2-picolinium chloride
C: 1-(N,N—dimethylcarbamoyloxy)pyridinium chloride Sensitizers
D: bis-(4-dimethylamino)benzophenone
E: 4-dimethylaminophenyl-2,6-diphenylpyridine
F: 2-(4'-dimethylaminophenyl)-4,5-diphenyl-1,2,3-triazole
G: 2-(dimethylaminophenyl)benzothiazole

EXAMPLE 7

(Comparison A)

Example 1 was repeated, except that this time the photooxidant used comprised 2.5 parts of 2,5-dichloro-1,4-bis(dichloromethyl)benzene. In this case the optical density of the recording layer measured at 590 nm was increased by exposure from 0.09 to 0.61, i.e. the change in optical density was only 0.52, corresponding to a lesser deepening in color intensity. Furthermore, the resist pattern produced in this case was no longer strippable from the copper sheet after 3 days without leaving a residual coating

EXAMPLE 8

A homogeneous mixture was prepared from the following constituents:
250 parts of ethyl acetate,
17 parts of trimethylolpropane triacrylate,
18 parts of the equimolar reaction product of bisphenol A glycidyl ether with acrylic acid,
53 parts of polymethyl methacrylate having a weight average molecular weight of 153,000,
3.4 parts of benzophenone
0.13 part of 2-(4'dimethylaminophenyl)-4,5-diphenyl-1,2,3-triazole,
0.5 part of crystal violet leuko base,
2.0 parts of (N,N-dimethylcarbamoyloxy)pyridinium chloride,
0.03 parts of Sicomet Patent Blue, and
5.94 parts of triethylene glycol diacetate.

This solution was first cast onto a polyester foil in such a way that the dry film thickness after solvent flashoff and drying was 35 μm. The optical density of the layer at 590 nm was 0.12.

To produce a resist pattern, the photopolymerizable resist layer was laminated at 110° C. onto a copper-clad circuit board substrate and subjected to a 30-second exposure through a photographic negative in a flat exposure unit with actinic light of a wavelength of 360 nm; the polyester foil was then removed and the unexposed areas of the layer washed out with 1,1,1-trichloroethane. Exposure brought about a strong deepening in the color intensity in the layer, the optical density of the layer at 590 nm changing by 0.72 to 0.84. The resist pattern produced was immaculately strippable from the substrate with methylene chloride, without residual coating being left behind, even after storage for 3 days.

EXAMPLE 9

(Comparison B)

Example 8 was repeated except that this time the 2 parts of (N,N-dimethylcarbamoyloxy)pyridinium chloride used in preparing the mixture were replaced by 3 parts of 2,5-dichloro-1,4-bis(dichloromethyl)benzene and the proportion of triethylene glycol diacetate was reduced from 5.94 parts to 4.94 parts. Starting from the same optical density at 590 nm of the unexposed resist layer, this time the increase in optical density brought about by exposure was only 0.2. The color contrast between exposed and unexposed areas was appreciably weaker than in Example 8. In addition, the resist pattern produced was no longer strippable from the substrate after 3 days.

EXAMPLES 10 TO 15

Example 8 was repeated, except that the (N,N-dimethylcarbamoyloxy)pyridinium chloride was replaced by the photooxidant mentioned in Table 1 below, in each case in an amount of 2 parts. Optical densities at 590 nm of the unexposed photopolymerizable resist layers corresponded to those of Example 8. The change in optical density at 590 nm brought about by imagewise exposure (ΔOD), this variable indicating the deepening in color density and, if referred to the background optical density in the unexposed areas, the color contrast obtained by exposure, is likewise shown in Table 1. The resist patterns produced were in all cases strippable without leaving a residual coating even after storage for several days.

TABLE 1

| Example | Photooxidant | ΔOD at (590 nm) |
|---|---|---|
| 10 | 1-ethoxy-2-picolinium tosylate* | 0.51 |
| 11 | 1-methoxy-2,6-dimethylpyridinium tetrafluoroborate* | 0.56 |
| 12 | 1-(isobutoxycarbonyloxy)-2-picolinium chloride | 0.81 |
| 13 | 1-(α,α,α-trichloroethoxycarbonyloxy)-pyridinium chloride | 0.79 |
| 14 | 1-(N—morpholinocarbonyloxy)pyridinium hexafluorophosphate | 0.72 |
| 15 | 1-(trifluoromethylsulfonyloxy)pyridinium trifluoromethanesulfonate | 0.68 |

*For comparison with German Laid-Open Application DOS 3,135,399

EXAMPLES 16 To 21

Example 8 was repeated, except that this time the 2-(4'-dimethylaminophenyl)-4,5-diphenyl-1,2,3-triazole was replaced by the sensitizers listed in Table 2 below, used in an amount of 0.13 part at a time. Each resist layer was subjected to a 1-minute imagewise exposure to produce the changes in optical density (ΔOD) at 590 nm indicated in Table 2 in the exposed areas.

TABLE 2

| Example | Sensitizer | OD (at 590 nm) |
|---|---|---|
| 16 | 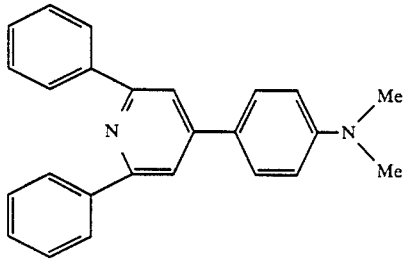 | (E) 0.71 |
| 17 | 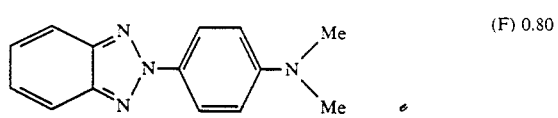 | (F) 0.80 |

TABLE 2-continued

| Example | Sensitizer | OD (at 590 nm) |
|---|---|---|
| 18 | H₃C-C(=N-N(...)-C₆H₄-NEt₂)-C(CH₃)=N | 0.83 |
| 19 | benzothiazol-2-yl-C₆H₄-NEt₂ | (G) 0.88 |
| 20 | (styryl-type N compound with NEt₂) | 0.65 |
| 21 | Et₂N-C₆H₄-C(=N-N=C(-O-))-C₆H₄-NEt₂ | 0.74 |

We claim:

1. A photopolymerizable recording material, comprising:
   (i) one or more photopolymerizable olefinically unsaturated organic compounds,
   (ii) one or more photopolymerization initiators,
   (iii) a sensitizer, and
   (iv) a color-forming system, comprising:
      (a) one or more colorless or virtually colorless organic compounds which are oxidizable to colored compounds, and
      (b) a photooxidant for the colorless or virtually colorless organic compound(s) (a), wherein photooxidant (b) comprises an organic salt with a substituted or unsubstituted hetaromatic system, this hetaromatic system having one or more built-in groups of the formula (I)

where R is substituted or unsubstituted alkenyl, alkynyl, hetaryl, alkenylcarbonyl, alkynecarbonyl, carbamoyl, alkylsulfonyl or arylsulfonylaminousulfinyl, substituted cycloalkyl or a substituted or unsubstituted hetaryl cation, with the proviso that the miximum of the long-wave absorption band of the salt is below 400 nm.

2. The photopolymerizable recording material of claim 1, wherein photooxidant (b) comprises a salt of a six-membered hetaromatic which has from 1 to 3 nitrogen atoms in the ring system and contains a group of the formula (I), or of a ring-substituted derivative thereof or of a benzo-fused or hetaryl fused derivative thereof.

3. The photopolymerizable recording material of claim 1, wherein photooxidant (b) comprises a compound of the formula (II)

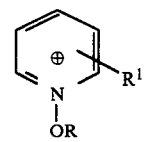

where R has the same meanings as for the group of the formula (I), R¹ is hydrogen or one or more substituted or unsubstituted alkyl groups, substituted or unsubstituted phenyl groups, alkoxy groups, vinyl groups, formyl groups, nitro groups or halogen atoms, it also being possible for two compounds of the formula (II) to be connected to each other via R or R¹, and A⊖ is the anion of an inorganic or organic acid, with the proviso that non anion A⊖ is present if one of R or R¹ is a radical carrying an anionic group.

4. The photopolymerizable recording material of claim 3, wherein in the compound of the formula (II) R is a substituted cycloalkyl of 6 carbon atoms.

5. The photopolymerizable recording material of claim 3, wherein in the compound of the formula (II), R is substituted or unsubstituted alkoxycarbonyl of 1 to 6 carbon atoms in the alkoxy group.

6. The photopolymerizable recording material of claim 3, wherein the compound of the formula (II) R is optionally identically or asymmetrically substituted N,N-dialkylcarbamoyl, with the proviso that the substituents on the nitrogen atom of the carbamoyl group can also be bonded together to form a ring.

7. The photopolymerizable recording material of claim 3, wherein in the compound of the formula (II) R¹ is hydrogen or one or more substituted or unsubstituted alkyl groups.

8. The photopolymeizable recording material of claim 7, wherein in the compound of the formula (II) R¹ is hydrogen or one or two methyl groups.

9. The photopolymerizable recording material of in claim 1, wherein the photooxidant (b) comprises either an N-alkoxycarbonyloxpyridinium salt or an N-carbamoyloxypyridinium salt.

10. The photopolymerizable recording material of claim 1, wherein photooxidant (b) comprises either an N-carbamoyloxypicolinium salt or an N-alkoxycarvbonyloxypyridinium salt.

11. The photopolymerizable recording material of claim 1, wherein the salt present as photooxidant (b) comprises a chloride, perchlorate, benzenesulfonate, toluenesulfonate, alkylsulfonate, terafluoroborate, hexafluorophosphate or trifluoromethanesulfonate anion.

12. The photopolymerizable recording material of claim 1, wherein the colorless or virtually colorless organic compound (a) which is oxidizable to a colored compound comprises as a leuco dye, in particular a triarylmethane dye in its leuco form 13. The photopolymerizable recording material of claim 1, wherein the photopolymerization initiator comprises an aromatic carbonyl compound, in particular benzophenone or a benzophenone derivative.

14. The photopolymerizable recording material of claim 1, wherein the sensitizer comprises a tertiary aromatic amine where the aromatic ring carrying the tertiary amino group is connected to a further aromatic or hetaromatic ring via conjugation.

15. The photopolymerizable recording material of claim 14, wherein the senitizer comprises a compound of the formula (III)

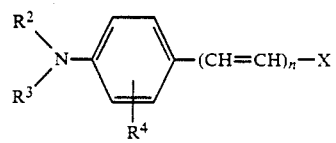

where $R^2$ and $R^3$ can be identical or different and each is substituted or unsubstituted alkyl of 1 to 6 carbon atoms, phenyl or aralkyl, $R^2$ and $R^3$ can also be bonded together to form a nonaromatic ring, $R^4$ is hydrogen or alkyl, X is substituted or unsubstituted benzoyl or a substituted or unsubstituted hetaromatic ring system, and n is either 0, 1 or 2.

16. A photoresist layer comprising a base material and the photopolymerizable recording material of claim 1.

17. A lithographic printing plate comprising a base material and the photopolymerizable recording material of claim 1.

18. A photoresist layer, comprising a base material and the photopolymerizable recording material of claim 3.

19. A lithographic printing plate, comprising a substrate and the photopolymerizable recording material of claim 3.

20. A lithographic printing plate, comprising a substrate and the photopolymerizable recording material of claim 15.

* * * * *